(12) United States Patent
Lee et al.

(10) Patent No.: US 6,286,749 B1
(45) Date of Patent: Sep. 11, 2001

(54) APPARATUS FOR MOVING A BONDING HEAD OF A WIRE BONDER IN X, Y AND Z AXIAL DIRECTIONS

(75) Inventors: Tae Hee Lee; Dong Hern Lee, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/235,754

(22) Filed: Jan. 25, 1999

(30) Foreign Application Priority Data

Jan. 23, 1998 (KR) .................................................. 98-2151
Jan. 23, 1998 (KR) .................................................. 98-2152
Jan. 23, 1998 (KR) .................................................. 98-2153
Jan. 23, 1998 (KR) .................................................. 98-2154
Jan. 23, 1998 (KR) .................................................. 98-2155

(51) Int. Cl.$^7$ .................................................. B23K 31/12
(52) U.S. Cl. .................. 228/102; 228/103; 228/110.1; 228/1.1; 228/8
(58) Field of Search .................. 228/102, 103, 228/110.1, 1.1, 8

(56) References Cited

U.S. PATENT DOCUMENTS

| | | | |
|---|---|---|---|
| 4,438,880 | * | 3/1984 | Smith et al. .............................. 228/1 |
| 4,978,050 | | 12/1990 | Amador . |
| 5,156,320 | | 10/1992 | Yanagida . |
| 5,199,630 | * | 4/1993 | Felber et al. ......................... 228/102 |
| 5,205,463 | | 4/1993 | Holdgrafer et al. . |

FOREIGN PATENT DOCUMENTS

| | | |
|---|---|---|
| 53-48461 | 5/1978 | (JP) . |
| 54-76061 | 6/1979 | (JP) . |
| 55-88343 | 7/1980 | (JP) . |
| 57-211740 | 12/1982 | (JP) . |
| 59-193037 | 11/1984 | (JP) . |
| 60-161628 | 8/1985 | (JP) . |
| 60-235431 | 11/1985 | (JP) . |
| 64-7629 | 1/1989 | (JP) . |
| 2-98151 | 4/1990 | (JP) . |
| 3-136340 | 6/1991 | (JP) . |
| 6-196521 | 7/1994 | (JP) . |
| 8-306732 | 11/1996 | (JP) . |

* cited by examiner

Primary Examiner—M. Alexandra Elve
(74) Attorney, Agent, or Firm—Jacobson Holman, PLLC

(57) ABSTRACT

An apparatus for moving a bonding head of a wire bonder in X, Y and Z axial directions according to the present invention comprises a linear guide member for guiding said bonding head in the X and Y axial directions, a XY moving means for providing a moving force in the horizontal (X and Y axial) directions to said linear guide member by causing an induced electromotive force, a Z moving means for providing a moving force in the vertical (Z axial) direction to a block of said bonding head by causing an induced electromotive force, a hinge means for converting said moving force of said Z moving means into a rotating force, and functioning as a rotation center so that the block is rotated in the direction to a wire clamp motion. Thus, the present invention is not necessary additional device, the assembly is simple and the volumn of entire apparatus is reduced. In this case, since weight to be moved is reduced due to the reduce of volumn, the position control of the bonding head is perfored accurately.

17 Claims, 11 Drawing Sheets

APPARATUS FOR MOVING A BONDING HEAD OF A WIRE BONDER IN X, Y AND Z AXIAL DIRECTIONS

BACKGROUND OF THE INVENTION

1. Field of the Invention

The present invention, in wire bonder performing an assembling process of semiconductor package, relates to an apparatus for moving a bonding head of a wire bonder in X, Y and Z axial directions and a method for controlling position of the bonding head in order to perform a wire bonding on an objective bonding position.

2. Description of Related Art

Generally, in a wire bonder, there is an apparatus for moving a bonding head, which performs a wire bonding to connect a lead with a pad, to an objective bonding position by moving a X, Y and Z tables.

Hereinafter, an apparatus for moving a bonding head of wire bonder of a prior art will be schematically described, referring to FIGS. 1 and 1A.

FIG. 1 is a perspective view showing apparatus for moving a bonding head of wire bonder, in X and Y axial directions, of a prior art.

As shown in FIG. 1, the apparatus for moving a bonding head of the prior art comprises a stage 100 having a tenon 100a longitudinally (i.e., in the X axial direction) formed on bottom portion and a pair of supporting members 102 protruded from both sides of an end thereof, a X table 104 having a linear motor (not shown) for providing a force moving longitudinally the stage 100 inside thereof and a tenon 104a longitudinally formed on bottom portion, an X base 106 having a groove 106a for receiving the tenon 104a of the X table 104 and guiding the X table 104 to be longitudinally moved, a Y table 108 having a linear motor (not shown) for providing a force moving transversely (i.e., in the Y axial direction) the stage 100 inside thereof, a groove 108a for guiding the stage 100 and a tenon 108b transversely formed on bottom portion, a Y base 110 having a groove 110a for receiving the tenon 108b of the Y table 108 and guiding the Y table 108 to be transversely moved, a moving bar 112 jointed to the supporting members 102 in order to move transversely the stage 100, a bearing 114 arranged on both sides of the moving bar 112, and a bracket 116 for fixing the bearing 114.

Further, each of the grooves has a plurality of holes (not shown) for providing air pressure inside thereof so that the tenons 100a, 104a and 108b of stage 100, X table 104 and Y table 108 can be moved in longitudinal or transversal direction in state that they are apart from the grooves.

When sub-driving portion supplies a control signal to the linear motors in order to control position, direction and angle of the bonding head, each of the linear motors moves rapidly the X and Y tables in a short motion section.

Hereinafter, operation of the apparatus as mentioned above will be schematically described.

In the state that the bonding head is disposed on the stage 100, when the linear motors disposed inside of X and Y tables 104 and 108 are operated, the X table 104 is moved along the groove 106a. Therefore, the stage 100 is longitudinally moved along the groove 108a. Also, the Y table 108 is tranversely moved along the groove 110a formed on the Y base 110 transversely. At this time, since the tenon 100a is received on the groove 108a, the stage 100 is transversely moved along with the Y table 108 and the moving bar 112 is transversely moved in the state contacted to the bearing 114.

In the apparatus, since the moving bar is moved in the state contacted to the bearing, it is difficult to increase velocity of the stage 100 to be moved. In addition, since the bearing is worn by a friction between it and the stage, there is a problem that maintenance of the bearing is required often.

FIG. 1A illustrates a motion character of the X and Y tables by operation of the linear motors.

As shown in FIG. 1A, since a converter changing a rotary force to linear force by means of a cam is used for transferring a mechanical power of motor to the stage, the mechanical power is applied to position offset from the centroid of ths stage "Cm (Xm, Ym, Zm)". Therefore, since unnecessary moments such as pitching moment "Mx" rolling moment "My" and yawing moment "Mz" causes in the stage, the life of stage is reduced and the entire volumne of apparatus is increased.

In the prior art, an apparatus for moving the bonding head in the Z axial direction moves finely a capillary, which is moved to a bonding position by motion of the stage, in the vertical direction in order to perform the wire bonding by operation of the bonding head.

The apparatus for moving the bonding head in the Z axial direction comprises a rotary servo motor providing a control signal to the linear motors in order to control position, direction and angle of the bonding head, an eccentric-driven cam and a moving block, which has a bearing, for converting a rotary motion into a vertical motion, and an encoder for sensing a rotation angle of the moving block. In this case, the capillary is finely moved by signal outputted from the encoder and performs the wire bonding.

Hereinafter, the apparatus of the prior art will be schematically described how the apparatus operates.

When the X and Y tables are moved by operation of the linear motors and the bonding head is moved to a bonding position, the rotary servo motor is rotated by required value, and the moving block is moved by the eccentric-drived cam in the vertical direction. Therefore, the capillary performs a wire bonding to connect lead to pad.

In the apparatus of the prior art as mentioned above, each of the linear motors have a cylindrical coil or a flat type magnet mainly. When the linear motor consists of the former cylindrical coil, it is difficult that the bonding head is rapidly moved because the apparatus is large and heavy than the other apparatus having a similar features. Also, when the linear motor has the latter flat type magnet, since hysterisis causes in a section which a small power is offerred, the apparatus needs additional device for retaining uniformly the power. Further, during moving, there is a problem that the X and Y tables may be shocked mechanically.

Furthermore, when a rotary servo motor is used as a power source of the apparatus, a device for converting motion, for example such as ball screw, coupling and so on, is required, and disassemble and assemble are difficult because the elements are many. More particularly, since all the positions of the bonding head in the X, Y and Z axes should be converted by means of the rotary servo motor, it is difficult that a final position of the stage is sensed accurately.

SUMMARY OF THE INVENTION

It is, therefore, an object of the present invention to provide an apparatus for moving a bonding head of a wire bonder in X, Y and Z axial directions and a method for controlling position of the bonding head capable of operating finely and controlling rapidly and accurately the bonding head, without additional converter, by disposing directly a linear motor for providing a linear motion character.

Further, the apparatus according to the present invention can accurately sense a final position of stage by separating encoder device and linear motors for moving the stage.

Also, the apparatus according to the present invention can prevent unnecessary moments from causing and reduce entire volumn of the apparatus.

In order to accomplish the above objects, the apparatus for moving a bonding head of wire bonder in the X, Y and Z axial directions, according to the present invention, comprises: a linear guide member for guiding the bonding head in the X and Y axial directions; a XY moving means for providing a moving force in the horizontal (X and Y axial) directions to the linear guide member by causing an induced electromotive force; a Z moving means for providing a moving force in the vertical (Z axial) direction to a block of the bonding head by causing an induced electromotive force; a hinge means for converting the moving force of the Z moving means into a rotating force, and functioning as a rotation center so that the block is rotated in opposite direction to a wire clamp motion.

Further, a method for controlling position of the bonding head, according to the present invention, comprises steps of : preprograming for setting X and Y coordinates of a linear guide member and Z coordinate of a capillary based on coordinate data outputted from a outside position controller; calculating for obtaining first position error which is generated between present XY coordinate of the linear guide member from each of the preprogramed X and Y coordinates and second position error which is generated between present XY coordinate of the capillary from the preprogramed Z coordinate; driving X, Y and Z linear motors based on the calculated errors; measuring displacements of the linear guide member by the X and Y linear motors and displacement of the capillary by the Z linear motor; and returning to the calculating step after checking the measured displacements.

BRIEF DESCRIPTION OF THE ATTACHED DRAWINGS

Other features in structure, operation and advantages of the present invention will become more apparent to those skilled in the art from the following descriptions when in conjunction with the accompanying drawings, in which.

DETAILED DESCRIPTIONS OF A PREFERRED EMBODIMENT

Hereinafter, the embodiment according to the present invention will be described in detail, referring to the accompanying drawings.

An apparatus for moving a bonding head of wire bonder in the X, Y and Z axial directions and a method for controlling position of the bonding head according to the present invention is embodied in order to control, rapidly and accurately, the bonding head without a mechanical wear.

Figure 1:
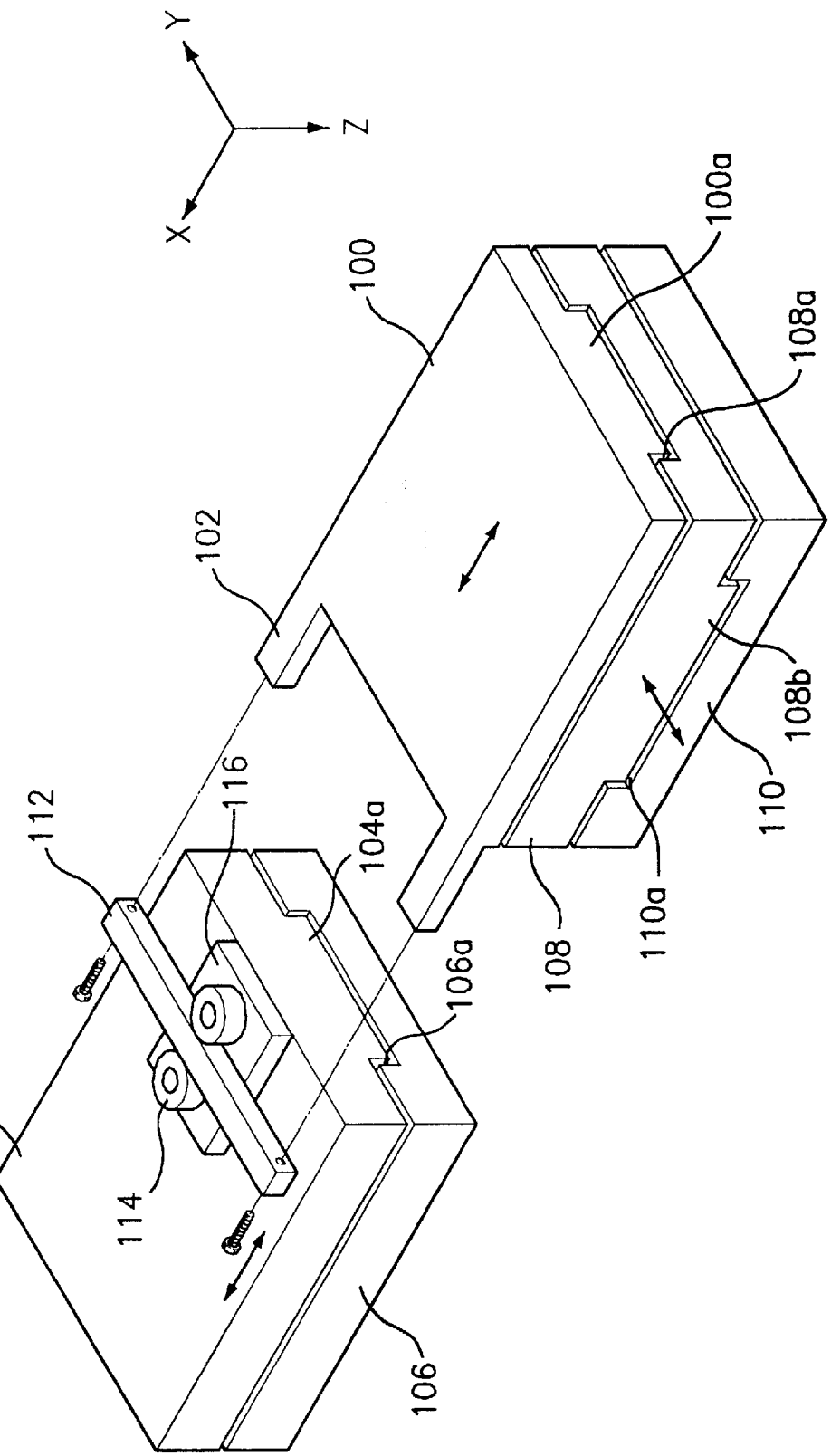
FIG. 1 is a perspective view showing an apparatus for moving a bonding head of a wire bonder, in the X and Y axial directions, of a prior art.
Figure 1A:
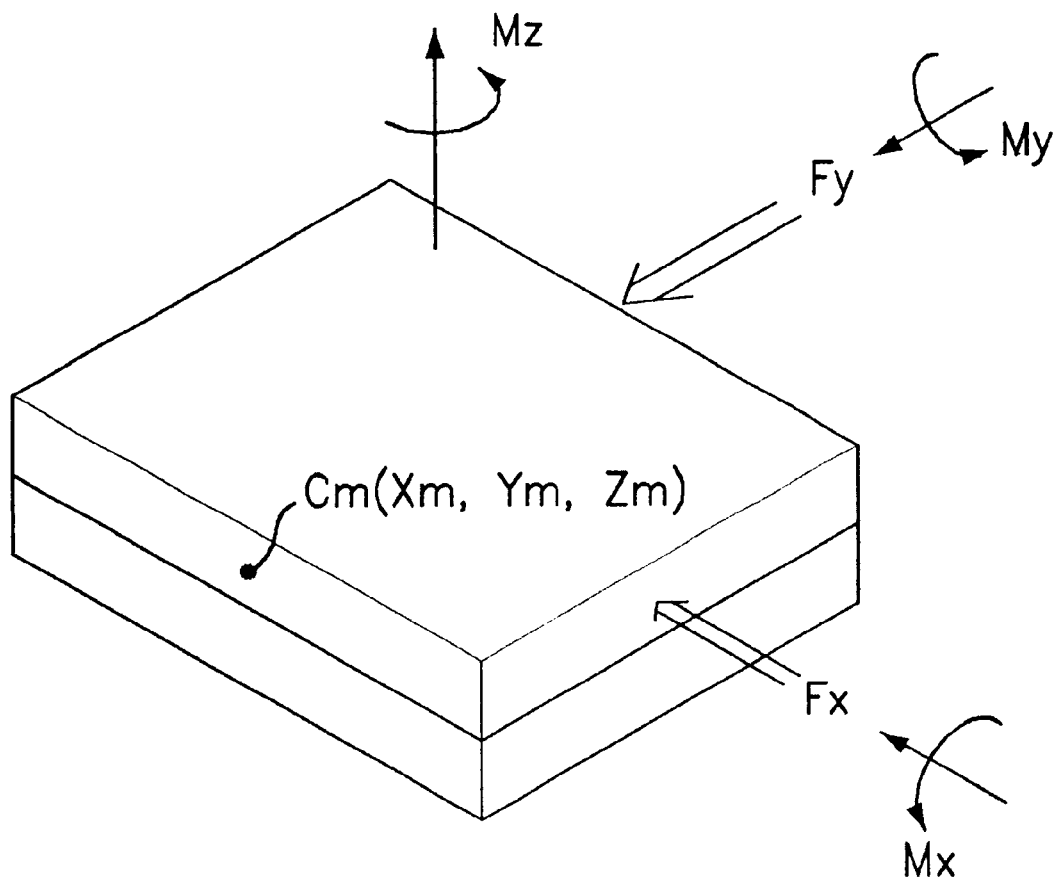
FIG. 1A illustrates a motion feature of the X and Y tables by operation of linear motors.
Figure 2:
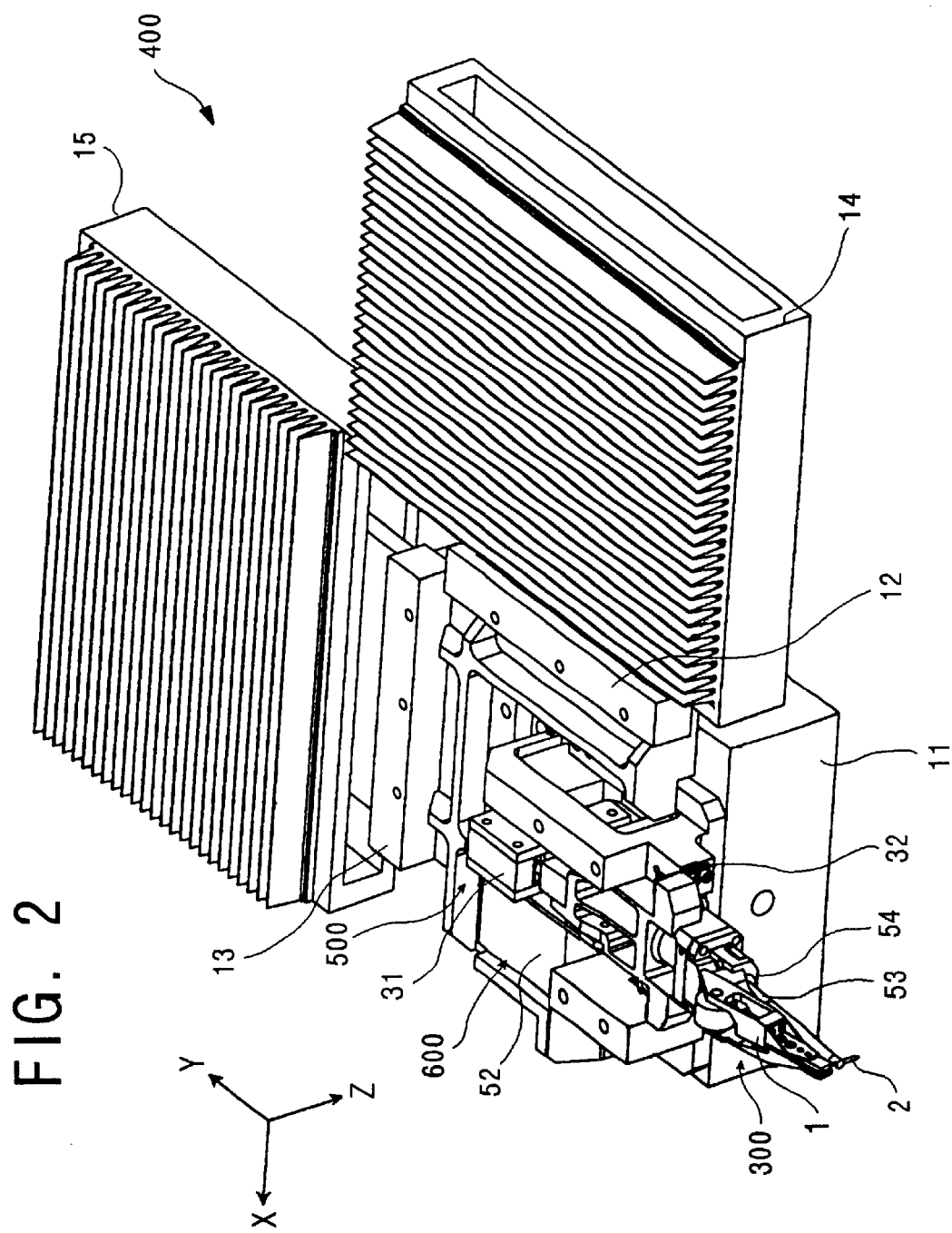
FIG. 2 is a perspective view showing an embodiment of apparatus for moving a bonding head of wire bonder in the X, Y and Z axial directions according to present invention.

FIG. 2 is a perspective view showing an embodiment of apparatus for moving the bonding head in the X, Y and Z axial directions according to the present invention.

As shown in FIG. 2, the apparatus of the present invention is divided into a bonding head assembly 300 for performing a wire bonding connecting a lead to pad, a XY moving portion 400 for providing a moving force in horizantal plane to the bonding head assembly 300, a Z moving portion 500 for providing a moving force in the vertical direction to tha bonding head assembly 300 and a controller 600 for controlling positions of the XY and Z moving portions.

All the elements will be detailedly described, referring to the FIGS. 3 to 8.

Figure 3:
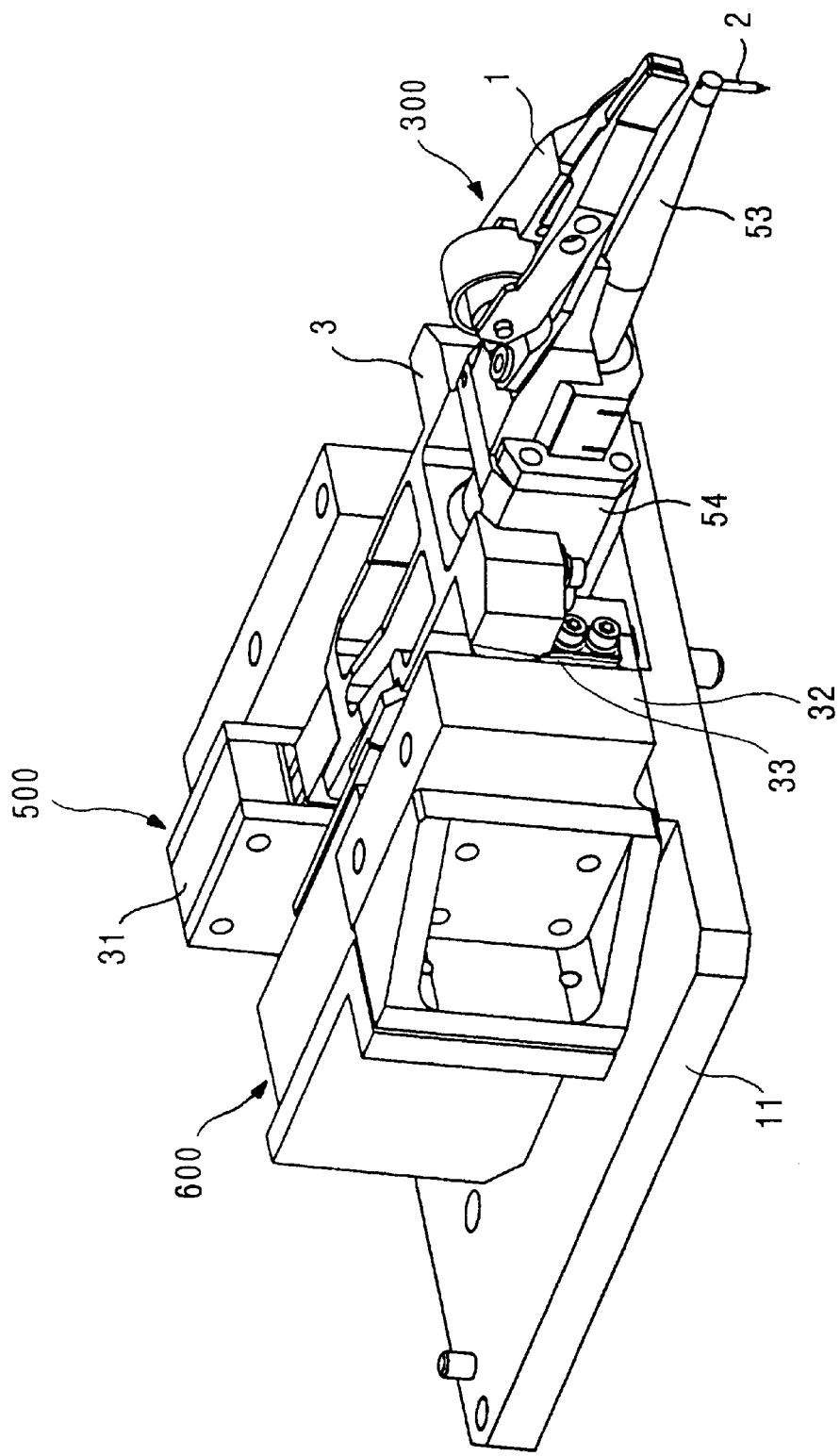
FIG. 3 is a perspective view showing detailedly a bonding head assembly of the apparatus according to the present invention.

FIG. 3 is a perspective view showing detailedly the bonding head assembly of the apparatus according to the present invention.

As shown in FIG. 3, the bonding head assembly 300 comprises a wire clamp 1 having capillary 2 for connecting lead to pad and a moving block 3 for providing a moving force to the wire clamp 1.

The bonding head assembly 300 is moved by operation of the XY moving portion 400, in the longitudinal (X axial) and transverse (Y axial) straight directions.

The XY moving portion 400 comprises a linear guide stage 11 disposing the bonding head assembly 300 on upper surface and guiding the bonding head assembly 300 in the X and Y axial directions, X and Y fixing members 12 and 13 respectively disposed on adjacent two end portions of the linear guide stage 11 and X and Y linear motors 14 and 15 disposed on the X and Y fixing members 12 and 13. In the construction, when an electric power is supplied to the X and Y linear motors 14 and 15, the X and Y linear motors 14 and 15 provide a force capable of moving, in the X and Y axial straight directions, the X and Y fixing members 12 and 13 by causing induced electromotive force.

Figure 4:
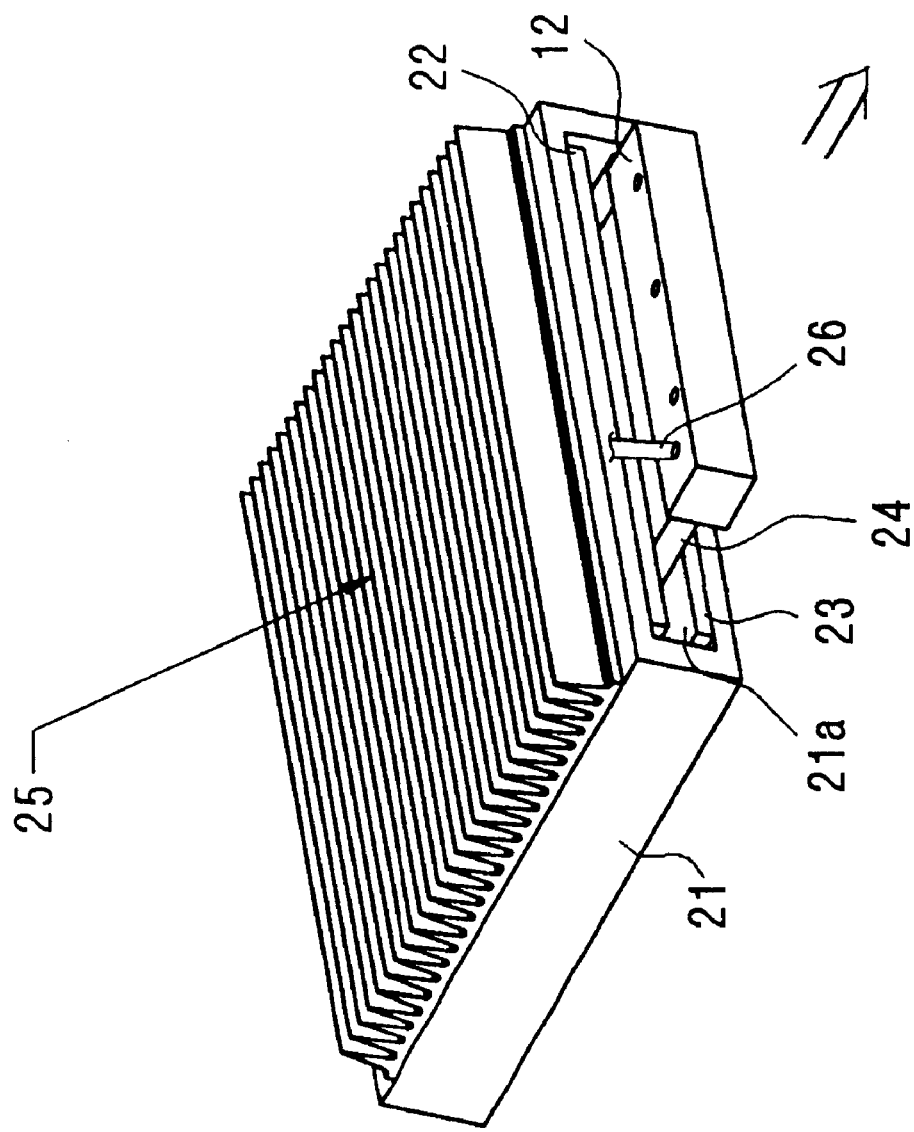
FIG. 4 is a perspective view showing detailedly X linear motor of the apparatus according to the present invention.

FIG. 4 is a perspective view showing detailedly the X linear motor of the apparatus according to the present invention.

As shown in FIG. 4, the X linear motor 14 comprises a housing 21 having a through hole 21a for forming a predetermined size space therein, a pair of magnets 22 and 23 disposed on upper and lower surfaces of the through hole 21a, a heat sink 25 disposed on upper portion of the housing 21, a power cable 26 connected to the fixing member 12. The power cable 26 transfers the electric power to a moving coil 24 fixed to the X fixing member 12 via the X fixing member 12. In this case, the moving coil 24 is straight moved along the through hole 21a by the induced electromotive force.

Furthermore, the Y linear motor 15 has elements and operation features equal to the X linear motor 14.

Figure 5A:
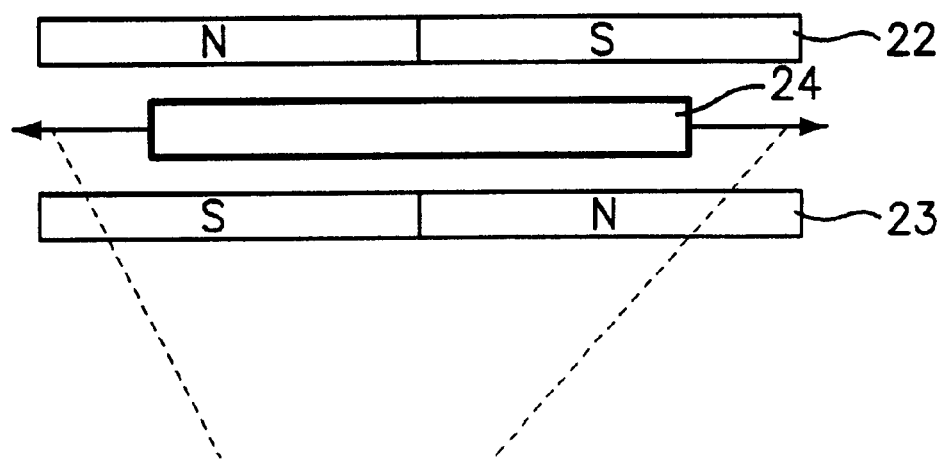
FIGS. 5A and 5B depict a concept for describing an operation of X and Y linear motors of the apparatus according to the present invention.
Figure 5B:
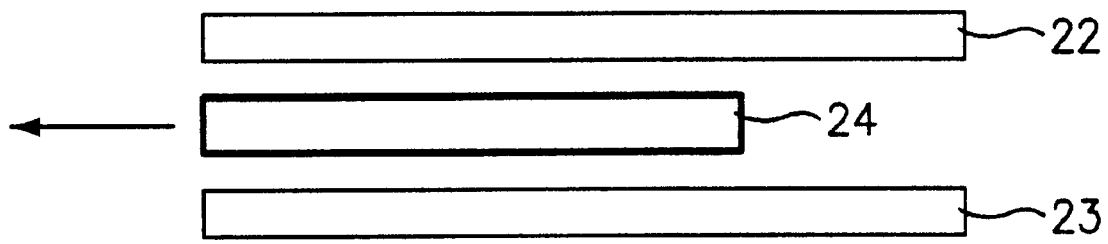

FIGS. 5A and 5B depict a concept for describing an operation of the X and Y linear motors of the apparatus according to the present invention.

In the state that the N and S poles of upper magnet 22 are faced to the S and N poles of lower magnet 23 (see FIG. 5A), when the electric power is supplied to the power cable 26, the moving coil 24 is straight moved inside of the through hole 21a by the induced electromotive force caused in the X and Y linear motors 14 and 15 (see FIG. 5B). At this time, magnetic field does not influence a perpendicular direction against the moving direction of the moving coil 24 (i.e., vertical direction).

Figure 6:
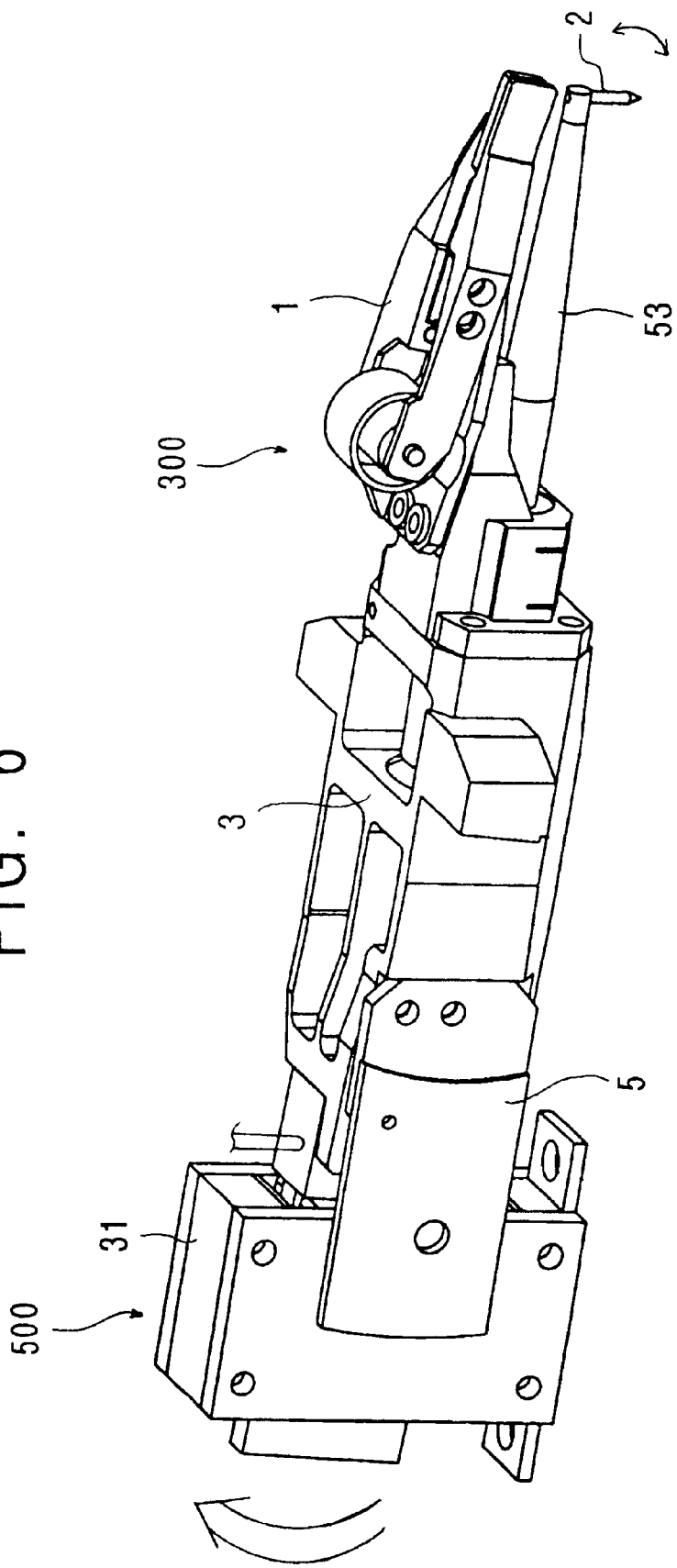
FIG. 6 represents an operation of a Z moving portion of the apparatus of the present invention.

FIG. 6 represents an operation of the Z moving portion of the apparatus for moving the bonding head assembly 300 in the vertical direction.

As shown in FIGS. 3 and 6, the Z moving portion 500 comprises a Z linear motor 31 disposed on the rear end portion of the moving block 3, a hinge assembly 32 for connecting the wire clamp 1 to the moving block 3, and a sheet-shaped plate spring 33 disposed on the hinge assembly 32. The Z linear motor 31 provides a moving force in the straight direction to the moving block 3. The hinge assembly 32 functions as a rotation center of the wire clamp 1 and the moving block 3, and converts the straight force of the Z linear motor 31 provided to the moving block 3 into a rotary force for rotating moving block 3. In this case, the plate spring 33 facilitates the rotation of the moving block 3.

At this time, the Z linear motor 31 provides a force for performing the wire bonding to the capillary 2.

Figure 7:
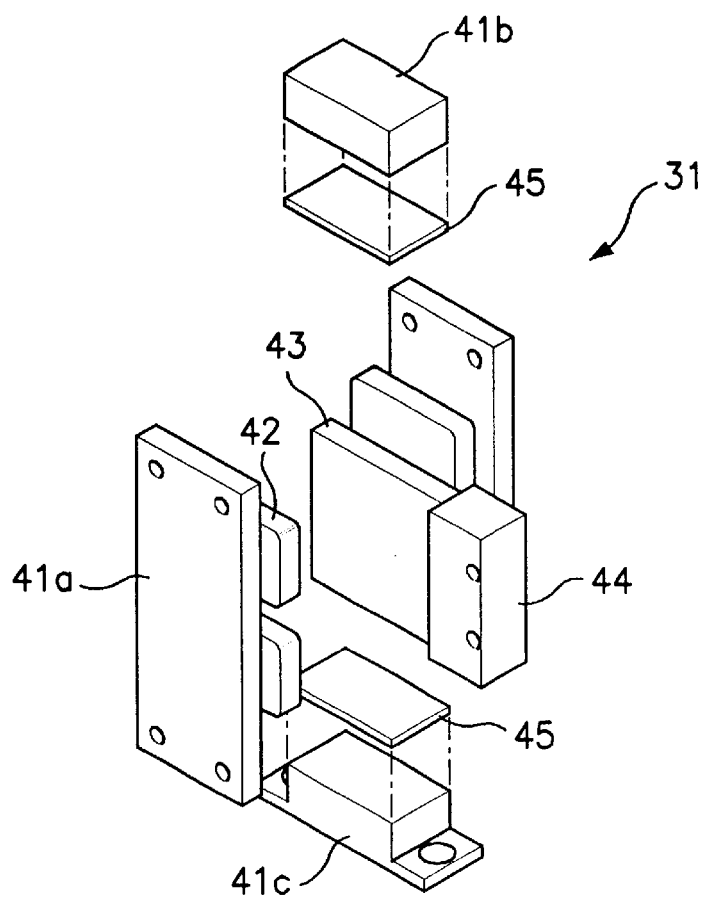
FIG. 7 is a disassembly perspective view showing a Z linear motor of the apparatus according to the present invention.
Figure 8:
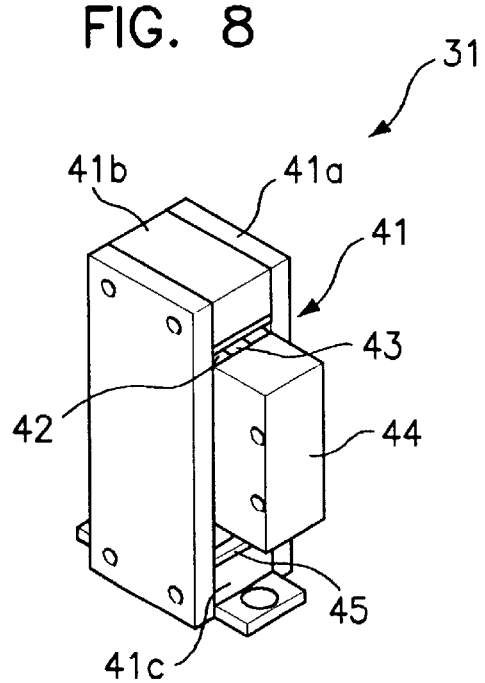
FIG. 8 is an assembly perspective view showing the Z linear motor of the apparatus according to the present invention.

FIG. 7 is a disassembly perspective view showing the Z linear motor of the apparatus according to the present invention and FIG. 8 is a assembly perspective view showing the Z linear motor.

As shown in FIGS. 7 and 8, the Z linear motor 31 comprises a main body 41 consisting of two side plates 41a apart from each other and upper and lower plates 41b and 41c disposed between the two side plates 41a, four magnets 42 disposed, two by two, inside of side plates 41a so that N poles of magnets disposed on one side plate are faced to S poles of magnets disposed on the other side plate. In other words, the N poles of two the magnets disposed on one side plate are faced to S poles of two the magnets disposed on the other side plate in order to cause an attraction inside of the main body 41.

In addition, the Z linear motor 31 has a moving coil 43 disposed on one side portion of a fixing plate 44. In this case, the moving coil 43 is moved in the up and down straight directions, inside of the main body 41, by the induced electromotive force. At this time, the moving coil 43 is not contacted to inside surfaces of the main body 41.

Further, each of the upper and lower plates 41b and 41c has a shock-absorbing pad 45 disposed on their opposite surfaces in order to absorb a shock caused by colliding the moving coil 43 with the upper or lower plate 41b or 41c.

Figure 9A:
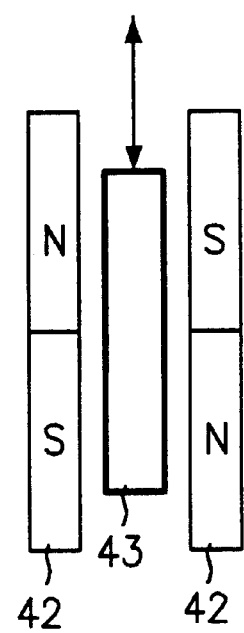
FIGS. 9A and 9B represent a concept for describing the operation of Z linear motor of the apparatus according to the present invention.
Figure 9B:
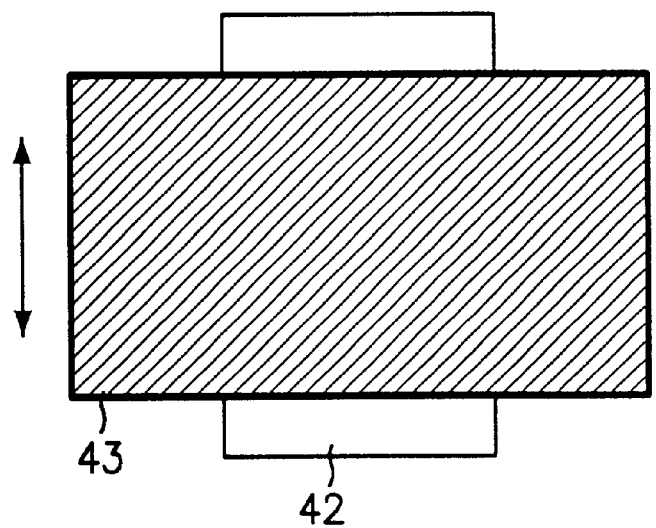

FIGS. 9A and 9B represent a concept for describing the operation of the Z linear motor of the apparatus according to the present invention.

As shown in FIGS. 9A and 9B, the Z linear motor is operated by the concept similar to the X and Y linear motors, but the moving coil 43 of Z linear motor is moved in the up and down straight directions. In other words, in the state that the N poles of magnets disposed on one side plate are faced to S poles of magnets disposed on the other side plate, when the electric power is supplied to the fixing plate 44, the moving coil 43 is moved in up and down straight directions by the induced electromotive force caused inside of the Z linear motor 31. At this time, a magnetic field does not influence a perpendicular direction to the moving direction of the moving coil 43 (i.e., horizontal direction).

In the constructions of the X, Y and Z linear motors 14, 15 and 31 operated by the concepts, the X, Y and Z moving coils 24 and 43 have a flat shape and their outside surfaces are molded. Further, an predetermined interval, about 0.1 mm –0.2 mm, exists between each of the magnets 22 and 23 of X and Y linear motors and the moving coil 24, and between each of the magnet 42 of the Z linear motor 31 and the moving coil 43.

When the electric power is supplied to the X, Y and Z linear motors 14, 15 and 31, the moving coils of the motors are continuously moved in the X, Y and Z axial directions and may start a high speed motion.

Lastly, the controller 600 for controlling motion position of each of the XY and Z moving portions will be described, referring to the FIGS. 3 and 6.

As shown in FIG. 3, the controller 600 comprises X and Y linear encoders (not shown) disposed between the linear guide stage 11 and each of X and Y fixing members 12 and 13, a Z linear encoder 52 disposed on one side of the moving block 3 and a converter 53 disposed on one end portion of the capillary 2.

The X and Y linear encoders sense a displacement of the bonding head assembly 300 by the operation of X and Y linear motors 14 and 15. The Z linear encoder 52 senses a rotation displacement of the bonding head assembly 300 by the operation of Z linear motor 31. At this time, the controller 600 calculates magnitude of the displacements sensed by the encoders. In this case, a hinge point of the hinge assembly 32 functions as a reference point for calculating the rotation displacement of the bonding head assembly 300. Also, the converter 53 changes a rotation angle data outputted from the Z linear encoder 52 to a coordinate data of capillary 2 to move at present.

The controller 600 further comprises a locker arm 54 calculating an error between the magnitude of displacement calculated by the controller 600 and a preprogramed XY coordinate of the bonding head assembly 300, and then controlling a position of the bonding head assembly 300 by operating the X and Y linear motors 14 and 15 based on the calculated error. Also, the locker arm 54 calculates a distanece between the hinge assembly 32 and a end portion of the capillary 2 sensed by the Z linear encoder 52, and then controls a position of the capillary 2 by operating the Z linear motor based on the calculated distance.

Figure 10:
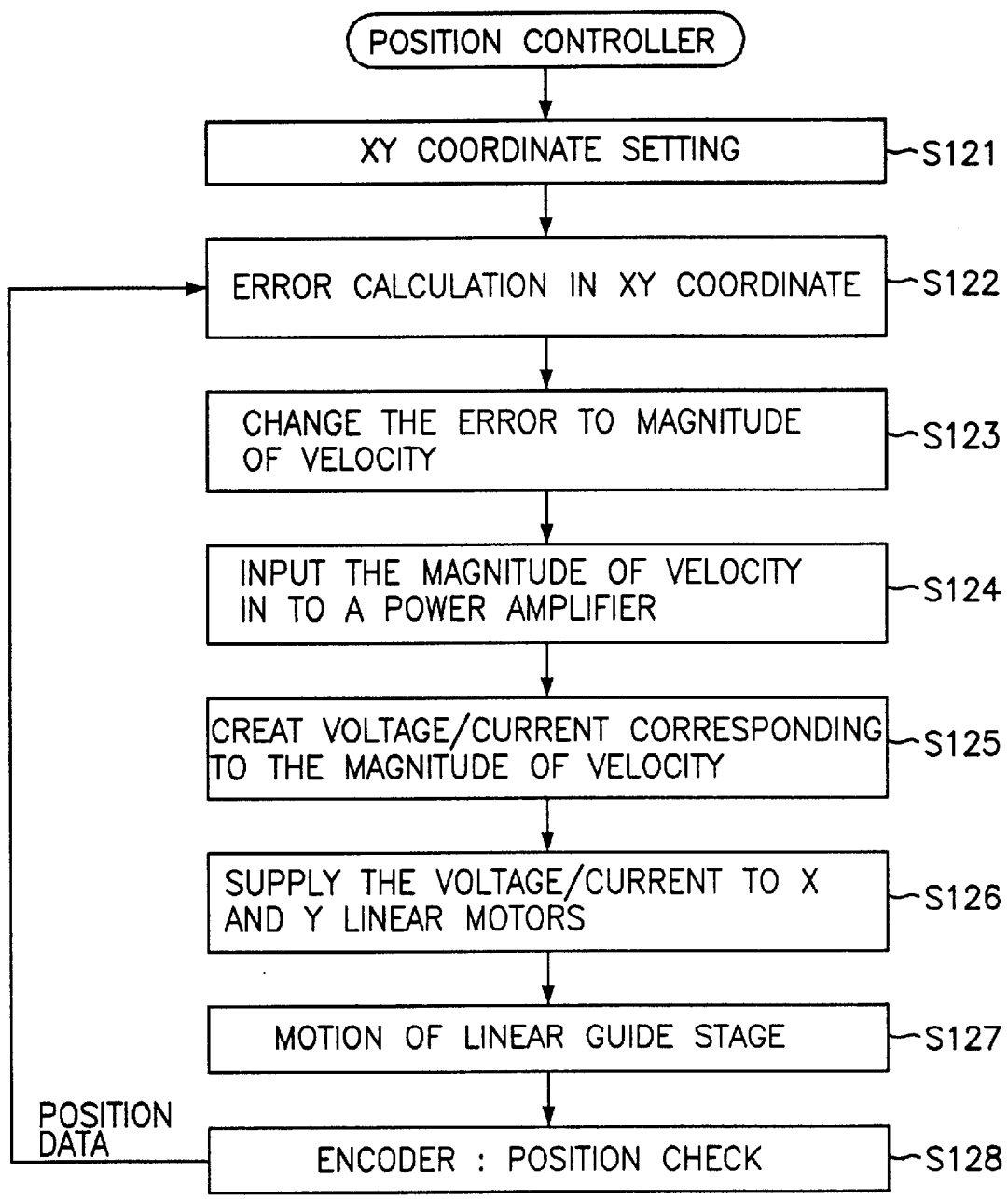
FIG. 10 is a flow chart showing a method for controlling XY axial positions of the bonding head according to the present invention.

FIG. 10 is a flow chart showing the method for controlling XY axial positions of the bonding head according to the present invention.

As shown in FIG. 10, the method for controlling XY axial positions according to the present invention comprises preprograming step for setting XY coordinates of the linear guide stage 11 based on XY coordinates data outputted from a outside position controller S121, and calculating step for obtaining an error which substrates present XY coordinate of the linear guide stage 11 from the preprogramed XY coordinate S122.

At this time, the position controller changes the calculated error to magnitude of velocity S123, and then inputtes the magnitude of velocity into a power amplifier S124. Thereafter, the power amplifier creates voltage/current corresponding to the magnitude of velocity S125, and then supplies the voltage/current to each of the X and Y linear motors 14 and 15 in order to drive the motors S126.

In this case, the mechanical power of each of the X and Y linear motors 14 and 15 is transferred to the linear guide stage 11 via the fixing members 12 and 13 in order to move the bonding head assembly 300, simultaneously, in the X and Y axial directions S127. At this time, the X and Y linear encoders disposed on the linear guide stage 11 check and measures a present position of the bonding head assembly 300 changed by motion of the X and Y linear motors 14 and 15 S128. Thereafter, by returning to the calculating step S122 and inputting a coordinate data compensating the calcualted error into the position controller, position control of the bonding head is performed.

Figure 11:
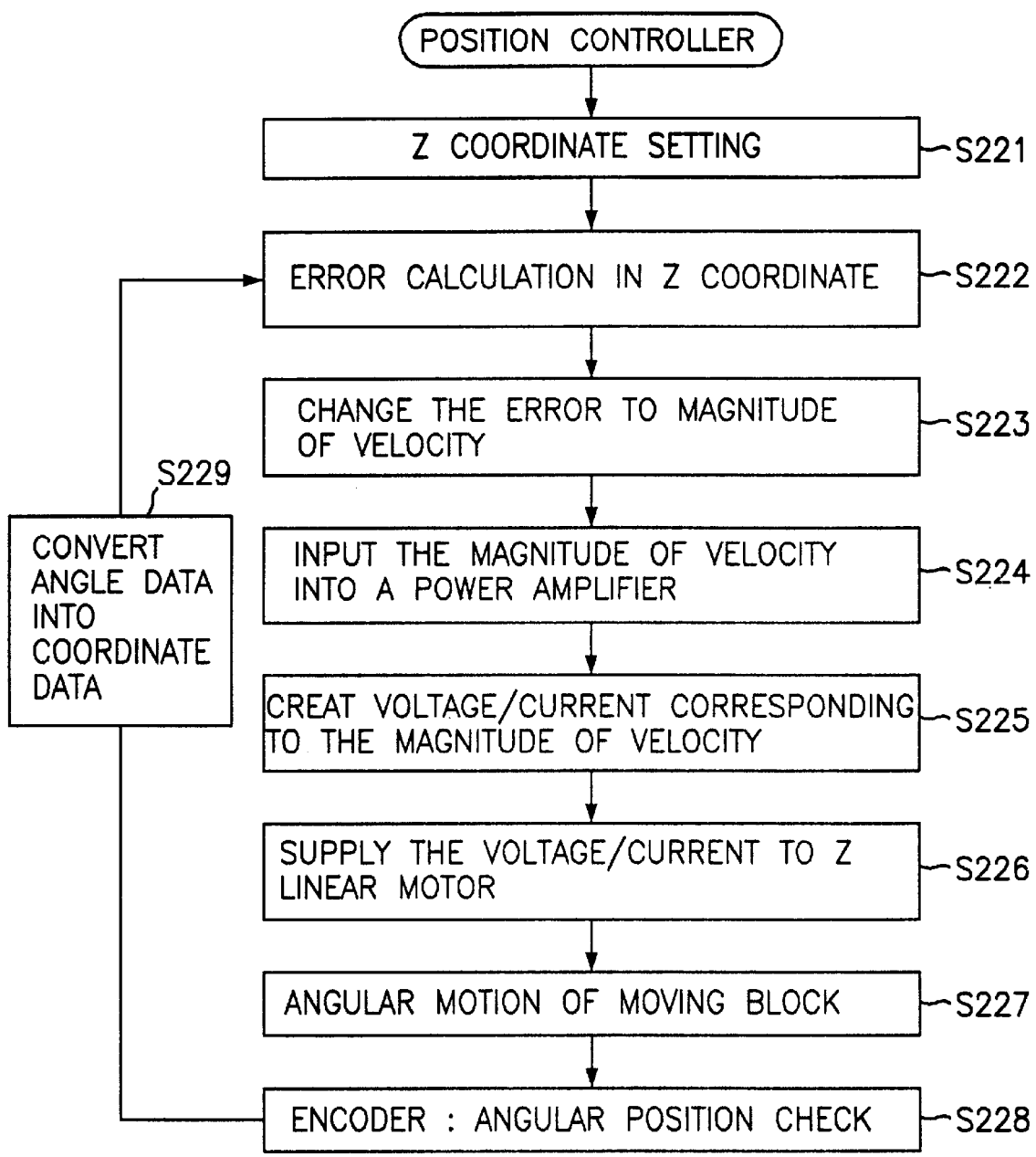
FIG. 11 is a flow chart showing the method for controlling Z axial position of the bonding head according to the present invention.

FIG. 11 is a flow chart showing the method for controlling Z axial position of the bonding head according to the present invention.

As shown in FIG. 11, the method for controlling Z axial position according to the present comprises preprograming step for setting Z coordinate of the capillary 2 based on Z coordinate data outputted from an outside position controller S221, and calculating step for obtaining an error which substrates present Z coordinate of the capillary 2 from the preprogramed Z coordinate S222.

At this time, the position controller changes the calculated error to magnitude of velocity S223, and then inputs the magnitude of velocity into a power amplifier S224. Thereafter, the power amplifier creates voltage/current corresponding to the magnitude of velocity S225, and then supplies the voltage/current to the Z linear motor 31 in order to drive the motors S226.

In this case, the mechanical power of Z linear motor 31 is transferred to the moving block 3 via the fixing member 44 so that the moving block 3 does angular motion S227.

Further, the Z linear encoder disposed on the moving block 3 checks and measures a present angular position of the bonding head assembly 300 changed by a rotation of Z linear motor 31 S228. Further, after converting a present angle data into a coordinate data of Z axis S229, the position control of Z axis is performed by returning to the calculating step S222.

Hereinafter, the apparatus of the present invention will be described how the apparatus operates.

A signal with XY coordinate data outputted from the position controller is transferred to the power amplifier. At this time, the power amplifier creates the voltage/current corresponding to the signal of coordinate data and then supplies the voltage/current to the moving coil 24 of the X and Y linear motors 14 and 15. Therefore, the moving coil 24 is, rapidly and straight, moved by the induced electromotive force caused inside the linear motor. Thereafter, the moving force of the moving coil 24 is transferred to the linear guide stage 11 via the X and Y fixing members 12 and 13. At this time, the bonding head assembly 300 is guided and moved in X and Y axial straight directions, thereby being positioned on bonding position. Further, the position of the linear guide stage 11 is measured by the X and Y linear encoders and the measured value is transferred to the position controller. In that case, the position controller compares preprogramed coordinate data with present coordinate data of the bonding head, and then if an error is measured, the position controller provides a position control order corresponding to the error to the X and Y linear motors 14 and 15 in order to move the bonding head.

Further, simultaneously with the operation of the X and Y linear motors 14 and 15, an electric power is supplied to the Z linear motor 31. At this time, the Z linear motor 31 is operated a method the same as X and Y linear motors 14 and 15. In that case, the moving coil 43 of Z linear motor 31 is moved from one end portion of the moving block 3 in Z axial straight direction and the moving block 3 is moved along with the moving coil 43. Further, the straight motion of the moving block 3 is converted to rotary motion on in up and down directions.

In this case, the capillary 2 of wire clamp 1 is rotated in direction opposite to the rotation direction of the moving block 3 centering around the hinge point of the hinge assembly and performs the wire bonding. At this time, the position of the Z linear motor 31 is measured by the Z linear encoder 52 and a rotation angular data outputted from the Z linear linear encoder 52 is converted into present coordinate data of the capillary 2 to move. The converted coordinate data is transferred to the position controller and correction of the capillary position is performed.

As mentioned above, since the flat type linear motor driven by the induced electromotive force moves directly the X and Y stage, the present invention is not necessary additional device, the assembly is simple and the volumn of entire apparatus is reduced. In this case, since weight to be moved is reduced due to the reduce of volumn, the position control of the bonding head is perforred accurately.

Further, since the present invention can restrain unnecessary motion moment such as yawing, pitching and rolling, life of linear guide member can be extended. In addition, since each magnet and moving coil is not contacted, mechanical friction is not exist, the bonding head can move rapidly and the hysteresis does not happen.

Furthermore, since a plurality of encoders are used for measuring operations of X, Y and Z linear motors, final position of the bonding head can be recognized accurately.

It should be understood that the present invention is not limited to the particular embodiment disclosed herein as the best mode contemplated for carrying out the present invention and is not limited to the specific embodiment described in this specification except as defined in the appended claims.

What is claimed is:

1. An apparatus for moving a bonding head of a wire bonder in X, Y and Z axial directions, comprising:

a linear guide member for guiding said bonding head in the X and Y axial directions;

a XY moving means for providing a moving force in the horizontal (X and Y axial) directions to said linear guide member by causing an induced electromotive force;

a Z moving means for providing a moving force in the vertical (Z axial) direction to a block of said bonding head by causing an induced electromotive force, said Z moving means including a main body having an upper plate, a lower plate, and two side plates spaced from each other, first and second pluralities of magnets disposed on an inner surface of each of said two side plates, respectively, to create an attraction inside said main body, a coil moved in the Z axial direction by said induced electromotive force created by said Z moving means, and means for connecting said block to said coil; and a hinge means for converting said moving force of said Z moving means into a rotating force, and functioning as a rotation center so that said block is rotated in an opposite direction to a wire clamp motion.

2. The apparatus as recited in claim 1, wherein said XY moving means includes a housing having a through hole, a plurality of magnets disposed inside of said housing in order to cause said induced electromotive force by an electric power supplied from outside, a coal moving inside said through hole in said X and Y directions by said induced electromotive force and a means for connecting said linear guide member to said coil.

3. The apparatus as recited in claim 2, wherein said coil of said XY moving means is disposed between said plurality of magnets within said housing without being in contact with said plurality of magnets.

4. The apparatus as recited in claim 1, wherein said coil of said Z moving means is disposed between said first plurality of magnets and said second plurality of magnets without being in contact with said first and second plurality of magnets.

5. The apparatus as recited in claim 3, wherein said plurality of magnets within said housing are spaced apart from said coil moving inside said through hole by approximately 0.1 mm–0.2 mm.

6. The apparatus as recited in claim 4, wherein said first and second pluralities of magnets are spaced apart from said coil by approximately 0.1 mm–0.2 mm.

7. The apparatus as recited in claim 4, wherein said Z moving means further includes a shock-absorbing pad disposed on an inner surface of each of said upper plate and said lower plate, said coil moving in a straight up and down direction responsive to said electromotive force, said shock-absorbing pads absorbing shock caused by collision of said coil with said upper and lower plates.

8. The apparatus as recited in claim 2, wherein each of said XY and Z moving means does not provide a force in the perpendicular direction to moving direction of their said coils.

9. The apparatus as recited in claim 1, wherein motions of said XY and Z moving means are simultaneously caused in the X, Y and Z directions of said linear guide member.

10. The apparatus as recited in claim 2, wherein said coil of said XY moving means has a rectangular flat-shape.

11. The apparatus as recited in claim 1, wherein said coil of said Z moving means has a rectangular flat-shape.

12. The apparatus as recited in claim 1, wherein each of said XY and Z moving means consists of linear motor.

13. The apparatus as recited in claim 1, further comprising a first sensing means for sensing a position change of said XY moving means in the X and Y axial directions, a second sensing means for sensing a rotation angular change of said Z moving means centering around a hinge point of said hinge means, and a position controller for controlling an X and a Y coordinate of said XY moving means and a Z coordinate of said capillary.

14. The apparatus as recited in claim 13, wherein each of said first and second sensing means consist of a linear encoder.

15. An apparatus for moving a bonding head of a wire bonder in X, Y and Z axial directions, comprising:

a linear guide member for guiding said bonding head in the X and Y axial directions;

an X linear motor for providing a moving force in a straight horizontal X axial direction to said linear guide member by causing an induced electromotive force;

a Y linear motor for providing a moving force in a straight horizontal Y axial direction to said linear guide member by causing an induced electromotive force;

a Z linear motor for providing a moving force in a straight vertical Z axial direction to a block of said bonding head by causing an induced electromotive force, said Z linear motor including a main body having an upper plate, a lower plate, and two side plates spaced from each other, a first plurality of magnets disposed on a first one of said two side plates and a second plurality of magnets disposed on a second one of said two side plates such that poles of said first plurality of magnets face opposite poles on said second plurality of magnets to create an attraction inside said main body, a coil disposed on a fixing plate and moved by said induced electromotive force in the Z axial direction, said coil having a flat rectangular shape and being substantially parallel with said two side plates and contactlessly disposed between said first and second plurality of magnets, said fixing plate connecting said block to said coil; and a hinge means for converting said moving force of said Z linear motor into a rotating force, and functioning as a rotation center so that said block is rotated in an opposite direction to a wire clamp motion.

16. The apparatus as recited in claim 15, wherein said Z linear motor further includes a shock-absorbing pad disposed on an inner surface of each of said upper plate and said lower plate, said coil moving in a straight up and down direction responsive to said Z axial electromotive force, said shock-absorbing pads absorbing shock caused by collision of said coil with said upper and lower plates.

17. The apparatus as recited in claim 15, wherein said first and second pluralities of magnets are spaced apart from said coil by approximately 0.1 mm–0.2 mm.

* * * * *